United States Patent [19]

Nazarathy et al.

[11] Patent Number: 4,942,583
[45] Date of Patent: Jul. 17, 1990

[54] MISALIGNMENT-TOLERANT, GRATING-TUNED EXTERNAL-CAVITY LASER

[75] Inventors: Moshe Nazarathy, Palo Alto; Paul Zorabedian, Mountain View; William Richard, Atherton; Tirumala R. Ranganath, Palo Alto, all of Calif.

[73] Assignee: Hewlett-Packard Company, Palo Alto, Calif.

[21] Appl. No.: 208,340

[22] Filed: Jun. 17, 1988

[51] Int. Cl.$^5$ .............................................. H01S 3/10
[52] U.S. Cl. ....................................... 372/20; 372/102
[58] Field of Search .................. 372/20, 2, 33, 92, 98, 372/100, 101, 102, 97; 350/420, 421, 433, 162.20, 162.22, 162.23, 162.24

[56] References Cited

U.S. PATENT DOCUMENTS

| | | |
|---|---|---|
| 3,974,507 | 8/1976 | Chemelli et al. .................... 372/101 |
| 4,203,652 | 5/1980 | Hanada ................................ 350/421 |
| 4,253,735 | 3/1981 | Kawamura et al. ................ 350/433 |
| 4,318,594 | 3/1982 | Hanada ................................ 350/433 |
| 4,530,574 | 7/1985 | Scifres et al. ........................ 350/420 |
| 4,589,115 | 5/1986 | Burnham et al. .................... 372/102 |
| 4,656,641 | 4/1987 | Scifres et al. ........................ 372/101 |

OTHER PUBLICATIONS

J. A. Arnaud, "Beam and Fiber Optics" 1976, p. 30, Academic Press.

Primary Examiner—Frank Gonzalez
Attorney, Agent, or Firm—Edward Y. Wong

[57] ABSTRACT

A grating tuned laser system having an anamorphic optical section (72) that produces a line image on the grating (73). This system is insensitive to tilt of the grating (73) about an axis (T) perpendicular to the rulings (74) of the grating (73). An embodiment that utilizes a degenerate external cavity is also insensitive to small lateral misalignment of the optical elements.

19 Claims, 8 Drawing Sheets

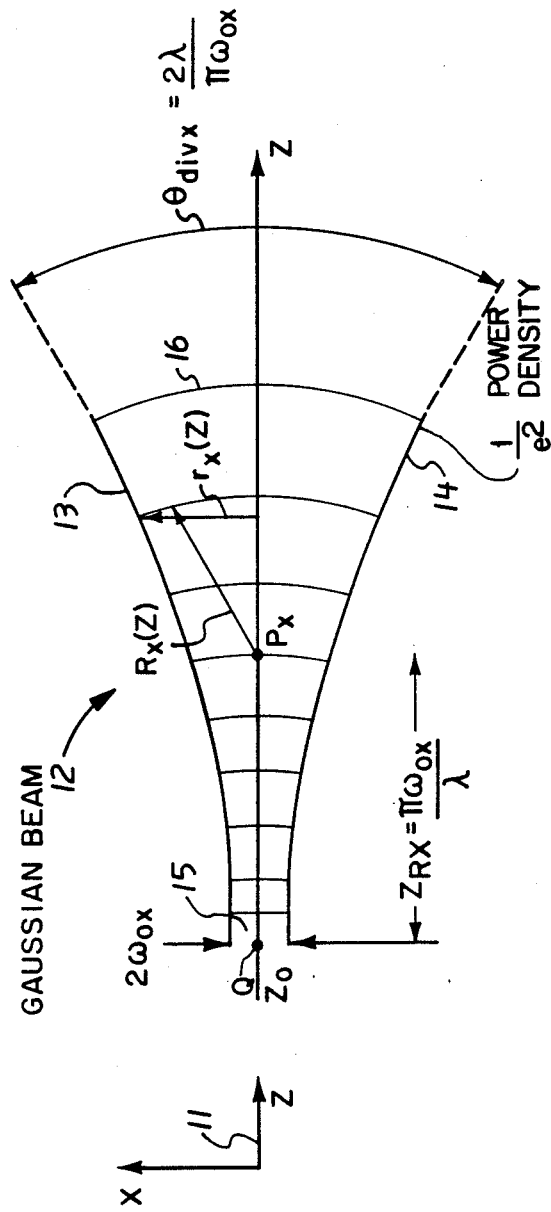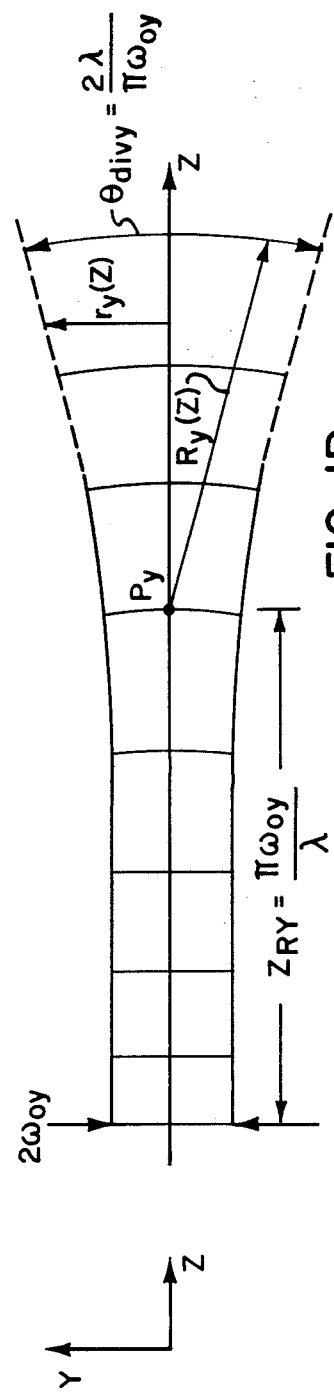
FIG 1A
FIG 1B

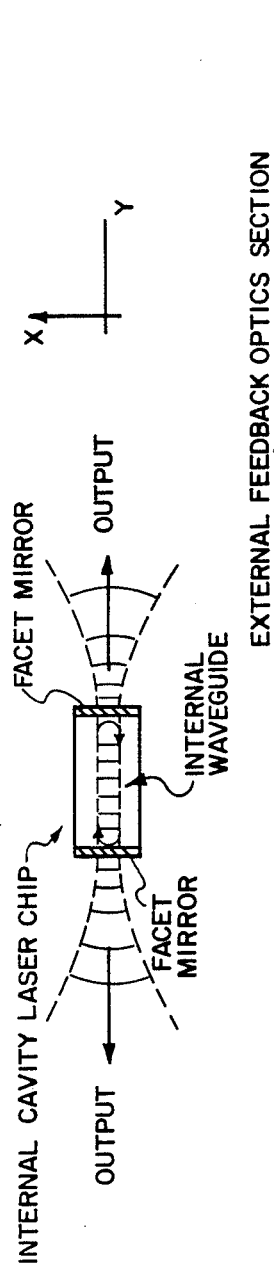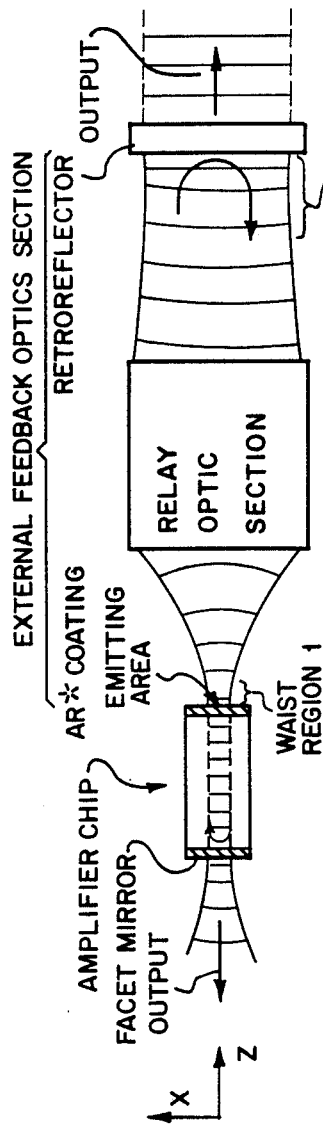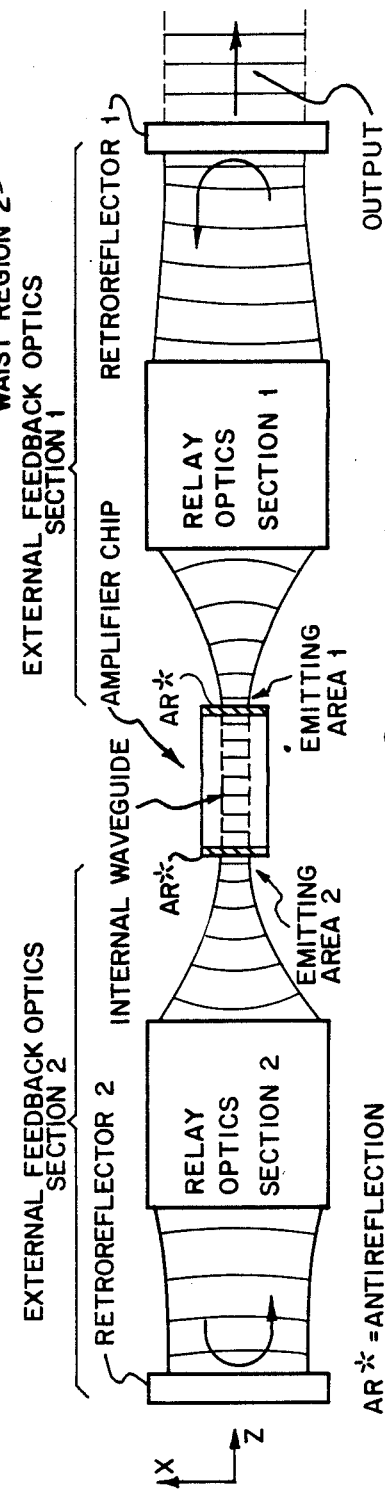

δ = LATERAL MISALIGNMENT DISTANCE
W = EMITTING AREA SPOT SIZE

MISALIGNMENT-TOLERANT, GRATING-TUNED EXTERNAL-CAVITY LASER

BACKGROUND OF THE INVENTION

Field of the Invention

This invention relates generally to lasers and more particularly to tunable external cavity semiconductor lasers. In the following discussion, the first digit of a reference numeral will indicate the first figure in which is presented the element indicated by that reference numeral.

DEFINITIONS

The "optical axis" of a laser beam is an axis parallel to the direction of the laser beam and centered laterally within the beam.

A "Gaussian beam" is an optical beam in which the power density exhibits a substantially Gaussian distribution as a function of perpendicular distance from the optical axis.

An "elliptical Gaussian beam" is one in which, in a plane perpendicular to the optical axis, the locus of points of the beam at which the power density of the beam is $1/e^2$ of the power density on the optical axis, has an elliptical shape.

A "laser spot", on a plane intersecting a laser beam, is the portion of a laser beam, incident on that plane with a power density greater than $1/e^2$ of the power density on the optical axis of the laser beam.

A "circular Gaussian beam" is an elliptical Gaussian beam in which the laser spot, on a plane perpendicular to the optical axis, is circular.

A "meridional plane" is a plane containing the optical axis.

At a given point on the optical axis, a "principal meridional plane" is a meridional plane that contains one of the elliptical axes of the laser spot on that plane. These two principal meridional planes are perpendicular.

In a laser system having a diffraction grating retroreflector, the "parallel meridional plane" is parallel to the rulings of the diffraction grating and the "perpendicular meridional plane" is perpendicular to the rulings of the diffraction grating.

A "waist" of a circular laser beam occurs at each point along the optical axis at which the wavefronts of light of the laser beam are planar.

In an elliptical Gaussian beam, a "principal meridional plane waist" occurs at each point along the optical axis at which the rays of light of the laser beam are parallel within that principal meridional plane.

An "anamorphic lens system" is one that has a different magnification in two principal meridional planes. For example, anamorphic lens systems are used to compress wide screen motion pictures into a regular film format which can be reexpanded onto the screen by another anamorphic lens system.

An "astigmatic lens system" is one that produces displaced image planes for light propagating in two different meridional planes. For example, a common eye defect is astigmatism in which horizontal lines of a checkerboard can be well focussed while vertical lines are blurred.

A grating is referred to as being in the "Littrow configuration" when it is oriented to retroreflect a selected wavelength of one of its diffraction orders back along the direction of an incident beam of light.

The "wavelength resolution" of a grating tuned external cavity laser is the wavelength range within which the optical feedback from the external cavity to the laser chip is greater than 50% of the peak value of feedback.

A "degenerate cavity" is a retroreflective optical system that always reflects back a given input distribution to coincide with the launched distribution, regardless of the misalignment of the launched distribution.

A "linear laser spot" is an elliptical laser spot in which the elliptical height is much smaller than the elliptical width.

A "nonhomogeneous beam expander" is an element that stretches one lateral dimension of a beam differently than its perpendicular lateral dimension.

A "homogeneous beam expander" expands both perpendicular lateral dimensions of a beam equally.

BACKGROUND

A laser consists of a Fabry-Perot resonator (cavity) that provides a feedback path through an optical gain element (i.e., an optical amplifier). The optical cavity can contain optical components such as lenses, mirrors, prisms, optical waveguides, filters, etalons, and diffraction gratings. The laser emits optical radiation when it is pumped above a threshold level by an external energy source. This resonator exhibits sufficient gain to lase only in narrow resonant peaks located at a set of discrete optical frequencies. Thus, the laser beam will contain one or more of these discrete frequencies.

Because of the wave nature of light, the laser beam does not have a sharply defined outer perimeter. The parameters that characterize a laser beam are illustrated in FIGS. 1A and 1B. In those figures, the z-axis has been selected to coincide with the optical axis 11 of a Gaussian beam 12.

In general, the power density in a laser beam exhibits a substantially Gaussian distribution as a function of perpendicular distance from the optical axis. Such beams are referred to as Gaussian beams. In the x-z plane shown in FIG. 1A, the locus of points at which the energy density is $1/e^2$ of the energy density on the optical axis at the same value of z is represented by lines 13 and 14. The transverse distance from the z-axis to a point on line 13 or 14 is represented as $r_x(z)$ and is called the spot size of the laser beam in the xz plane.

A region 15 in which lines 13 and 14 are parallel is referred to as a waist of the laser beam. The radius of the beam at the waist is represented as $w_{ox}$ and the z-position of the waist is represented as $z_{ox}$. The wavefronts 16 of the laser beam exhibit a radius of curvature $R_x(z)$ that is a function of z. In the far-field region (i.e., at distances from the waist much larger than $w_{ox}$), wavefronts 16 are substantially centered on a common point $P_x$ so that the beam appears to be emitted from point $P_x$. In the far-field region of a monochromatic laser, lines 13 and 14 diverge at an angle $\theta_{divx}$ equal to 2 times the wavelength of the laser beam divided by pi times the waist size $w_{ox}$.

The distance between point $P_x$ and a point $Q_x$ at $Z_{ox}$ is called the Rayleigh distance, is referenced as $z_{Rx}$ and is equal to pi times $w_{ox}$ squared divided by the wavelength. Thus, the shape of the Gaussian beam is uniquely defined by the waist position $Z_{ox}$ and the waist spot size $w_{ox}$ (see, for example, A. E. Siegman, Lasers, University Science Books, Mill Valley, Calif. 1986).

Optical elements, such as lenses, prisms, and mirrors affect the spot size radius $r_x(z)$ and wavefront curvature $R_x(z)$. Suitable arrangements of these elements can produce additional waists along the optical axis. The matrix math for analyzing the propagation of Gaussian beams through optical systems is well developed and straightforward (see, for example, A. Gerrard and J. M. Burch, Introduction to matrix Methods in Optics, John Wiley and Sons, London, 1975).

In general, a Gaussian beam need not be cylindrically symmetric about the optical axis. In general, the wavefronts will be elliptical and, in any cross-section perpendicular to the optical axis, will exhibit an elliptical spot size. The location $z_{ox}$ of a waist in the xz-plane need not coincide with the location $z_{oy}$ of a waist in the yz-plane. The x- and y-axes can be selected to be respectively oriented along the major and minor principal axes of such ellipse so that the xz and yz planes are the principal meridional planes at that point. When this is done, the Gaussian beam is characterized by the spot size radius $r_x(z)$ in the xz-plane, the spot size radius $r_y(z)$ in the yz-plane, the radius of curvature $R_x(z)$ of the wavefronts in the xz-plane, the radius of curvature $R_y(z)$ of the wavefronts in the yz-plane, the waist location $z_{ox}$ in the xz-plane and the waist location $z_{oy}$ in the yz-plane. In FIG. 1B is shown a cross-section of the beam in the yz-plane.

In a semiconductor laser, the semiconductor chip acts as the gain medium and also as a section of optical waveguide. Such a laser may also contain structures that act as mirrors or distributed, wavelength-selective reflectors. If the feedback path is completely contained within the boundaries of the semiconductor chip, the laser is called an internal-cavity semiconductor laser and is illustrated in FIGS. 2A-2C. These figures respectively illustrate an internal cavity solid state laser, a one-sided external cavity laser, and a two-sided external cavity laser. The internal waveguide terminates at the end faces of the laser chip. From each end face, light is emitted from a small emitting area approximately 1-2 microns across.

It is desirable for a laser to have a narrow linewidth. This linewidth is inversely proportional to the cavity Q, which increases with cavity length. However, because the threshold of a semiconductor chip increases with length, when extended beyond an optimum value, the length L of semiconductor lasers is generally 0.20–0.25 mm, resulting in a mode spacing of 1 nm. Since the cavity Q increases with length, limiting the chip length tends to limit the sharpness of the laser linewidth. Also, the wavelength-selective structures that presently can be integrated into a semiconductor chip are not as broadly tunable as optical elements that cannot be integrated into the chip.

In FIGS. 2B and 2C are illustrated external-cavity lasers (ECL's), so named because part of the feedback path of the laser is external to the semiconductor chip. In an ECL laser, the external elements need to control selection of the laser oscillation wavelength. Therefore, feedback from the external portion of the resonator must dominate feedback from the internal portion of the resonator. To weaken the internal feedback, the end faces can be coated with an antireflection coating to reduce the percent of light reflected at the end faces or they can be tilted so that reflections do not couple back into resonant modes.

In FIG. 2B, only one end face is coated with an antireflection coating. The other end face continues to serve as a mirror. This embodiment is a one-sided ECL. In FIG. 2C, both end faces are coated with an antireflection coating and two external feedback paths are included. This is a two-sided ECL.

Each external feedback section generally includes a relay optics section and a retroreflector. The components of the relay optics section generally collect, direct, and transmit light from the emitting area of the chip face onto the retroreflector and then back onto the emitting area. Although the following discussion will be in terms of planar emitting and retroreflecting surfaces, the following analysis also applies to those cases in which these surfaces are nonplanar. For example, a curved retroreflector can be replaced by a planar retroreflector plus a lens and then the lens portion of this modified retroreflector can be grouped as part of the relay optics.

For tunability, either a wavelength-selective retroreflector (e.g., a diffraction grating) can be used or a transmitting filter can be included in the relay optics section. To achieve strong external feedback, the external feedback section: (1) should have low loss; (2) should focus the fed-back light onto a spot the same size as the emitting area; and (3) the fed-back spot must overlap the emitting area.

In a diffraction grating tuned laser (as illustrated in FIGS. 3 and 4), a grating 31 is mounted in a holder that is rotatable about an axis P that is substantially parallel to the axis 32 that is parallel to the rulings 33 of the grating. Since the grating diffracts the incident beam into a multiplicity of spectral orders (illustrated in FIG. 4) that are each spread over a small range of angles about axis P, each of these orders can be used as the retroreflected beam. Wavelength selection is then achieved by rotation of the grating about this rotation axis P to sweep this order across the emitting surface of the laser. Unfortunately, perfect alignment of this rotation axis P with the direction 32 of grating rulings 33 is not possible so that rotation about axis P will also produce some tilt of the grating about an axis T that is coplanar with the grating and perpendicular to rotation axis P. Because of the small diameter of the laser beam relative to the separation of the grating from the laser emitting surface, the amount of coupling from the grating back to the laser is very sensitive to rotation about the T axis. This makes such a laser system sensitive to mechanical shock and vibration in addition to rotations about the P axis for selection of the laser wavelength.

For long term output power stability and for tuning over a broad range, grating 31 must be intentionally rotated about the T-axis to compensate for undesired rotation of rulings 33 about the T axis when the grating is rotated about the P-axis. This tight alignment tolerance makes it difficult to design a rugged commercial grating tuned external cavity laser system.

Presently, continual alignment is maintained by manual or electromechanical adjustment of the grating about the P-axis. Unfortunately, manual adjustment is slow, requires continual intervention of a skilled operator and does not lend itself to remote programmed operation. Electromechanical adjustment has a limited response bandwidth and is affected by the general problems of servo-mechanisms (e.g., mechanical shock may push alignment outside the capture range of the servo loop).

SUMMARY OF THE INVENTION

In FIGS. 2B and 2C, respectively, are illustrated side views of one-sided and two sided external cavity lasers. FIG. 3 is a perspective view of the one-sided external cavity laser of FIG. 2B, for the special case in which the retroreflector is a diffraction grating. Each external cavity includes a relay optics section and a retroreflector. For strong feedback, at each retroreflector, the wavefront (i.e., surface of constant phase) of the laser beam must coincide with the surface of the retroreflector.

That this condition is necessary for strong feedback can be seen as follows. Each point of a wavefront travels in a direction perpendicular to the wavefront at that point. At the retroreflector, if this wavefront has the same shape as the retroreflector's reflecting surface, then the direction of travel of that point in the wavefront is normal to the reflecting surface and is therefore reversed by the reflecting surface. When this happens across the entire surface of the wavefront, each point of the wavefront is retroreflected back along the same path that it travelled from the laser to the retroreflector. This results in the laser beam arriving back at the laser emitting surface in phase across the entire beam. In addition, because each ray of the beam retraces its path from the laser to the retroreflector, the retroreflected beam will have a spot size at the laser equal to the size of the laser emitting surface. This is important not only in directing substantially all of the selected wavelength of light back into the laser, but is also important in this light matching the mode of the laser responsible generation of that mode. The mathematics of the reference by Siegman can be used to prove these results.

When the laser emitting surface is planar, the laser beam has a waist in both principal meridional planes at this surface. When the retroreflector's reflecting surface is planar, the requirement that the wavefront at the retroreflector have the same shape as the retroreflecting surface if and only if the beam exhibits a waist at the retroreflecting surface in both principal meridional planes.

An incident wavefront of the beam will coincide with the reflecting surface of the retroreflector only if the retroreflector is carefully aligned with respect to the laser beam. The tolerance to angular misalignment of the retroreflector is determined by the divergence angle of a diffraction order of the grating. If the grating is rotated by $\frac{1}{2}$ of the divergence angle, then the intensity of the beam onto the emission face of the laser will be less than $1/e^2$ of the peak intensity of the beam, thereby severely degrading feedback to the chip laser. As indicated in FIGS. 1A and 1B, the divergence angle is inversely proportional to the lateral dimension of the source of the Gaussian beam. For the diffraction order directed back to the chip laser, the source for this diffraction order is the laser spot imaged onto the diffraction grating. Therefore, the tolerance to misalignment to rotation of the grating about the P-axis is inversely proportional to the width $2 W_P$ of the laser spot on this grating.

As illustrated in FIG. 4, a diffraction grating 31 diffracts an incident light beam 42 into multiple diffraction orders (such as orders 43 and 44). In a grating tuned laser system, grating 31 is rotationally oriented about an axis P (that is parallel to the rulings 33 of grating 31) to retroreflect light in a single one of these orders back to the laser. This retroreflecting configuration is known as the Littrow configuration. The profile of each of the grating rulings 33 is typically selected to make this retroreflected order much stronger than the other orders. Wavelength selection for the laser is achieved by rotation of the grating about the P axis.

In FIG. 4, the axis perpendicular to the grating face 46 is designated as the N-axis and the axis that is perpendicular to both the P- and N-axes is designated as the T-axis. The axis of incident beam 42 is referred to herein as the optic axis A, the AP plane is referred to herein as the parallel meridional plane and the AT plane is referred to herein as the perpendicular meridional plane. In the perpendicular meridional plane, the grating disperses light according to the Bragg condition. In the parallel meridional plane, the grating acts like a mirror. Thus, misalignment of the grating about the T-axis will tilt the retroreflected beam away from the laser emitting surface, severely degrading operation of the laser.

The wavelength resolution of a grating tuned external cavity laser system is proportional to the number of rulings 33 covered by incident laser beam 42 and is therefore proportional to the width ($2 W_T$), in the T-direction, of the laser spot 47 on grating face 46. Therefore, in accordance with the illustrated preferred embodiments, an anamorphic relay section is used to produce on grating face 46 a spot 47 having a height ($2 W_P$) much smaller than its width ($2 W_T$) so that the laser is much less sensitive to rotations about the T-axis than about the P axis. Spot 47 is substantially elliptical so that the height $2 W_P$ and the width $2 W_T$ are just the lengths of the minor and major axes of elliptical spot 47. As indicated above, an anamorphic optical section has different magnifications in the two principal meridional planes (see, the reference by A. E. Siegman). Such a section will typically include anamorphic and/or astigmatic elements. As indicated above, an astigmatic optical element produces displaced image planes for light propagating in two different meridional planes.

To ensure that the tuning behavior of the external cavity laser is dominated by the mode structure of the external cavity rather than that of the cavity internal to the semiconductor chip laser, the external cavity wavelength resolution must be on the order of or less than one-tenth the chip cavity mode spacing (i.e., the wavelength difference between adjacent modes of the chip cavity). For a typical grating pitch (i.e., spacing between adjacent rulings of the grating) of 0.83 microns and a wavelength of 1300 nm, this resolution condition requires a spot width $2 W_T$, of the beam on the grating, on the order of or greater than 0.2 cm. If the spot were substantially circular, this spot size would require a rotational alignment tolerance about the T-axis of less than 1 milliradian. Such a tight alignment tolerance is not practical for a low maintenance, rugged device.

In addition to angular misalignment of elements, the laser system is also sensitive to lateral (i.e., perpendicular to the optical axis of the incident beam) and longitudinal (i.e., parallel to the optical axis of the incident beam) misalignment of elements. FIG. 5 illustrates the case in which the relay optics is laterally misaligned by a distance δ from the emitting area of the laser amplifier. A lateral misalignment by a distance δ equal to the lateral dimension of the emitting area can severely reduce the feedback from the external cavity. Sensitivity to such misalignment is reduced by selecting the external cavity dimensions so that it forms a degenerate cavity (see, J. A. Arnaud, *Beam and Fiber Optics*, Academic Press, New York, 1976) as illustrated in FIG. 6. A degenerate cavity is a retroreflective optical system that always reflects back a given input distribution to coincide with the launched distribution, regardless of the misalignment of the launched distribution. From the viewpoint of geometrical ray tracing, an arbitrary ray retraces its own path after a single round trip through the system. From the point of view of optical transformation theory (see the reference by A. Gerrard, et al), the degeneracy condition requires that a ray traverse a closed path in a single trip from the emitter to the retroreflector and back to the emitter and that the off-diagonal elements of the overall round-trip ray matrix are zero.

DESCRIPTION OF THE FIGURES

FIGS. 1A and 1B are top and side views, respectively, of a Gaussian optical beam.

FIG. 2A is a side view of an internal cavity laser chip.

FIG. 2B is a side view of a one-sided external cavity laser.

FIG. 2C is a side view of a 2-sided external cavity laser.

DESCRIPTION OF THE PREFERRED EMBODIMENT

Figure 3:
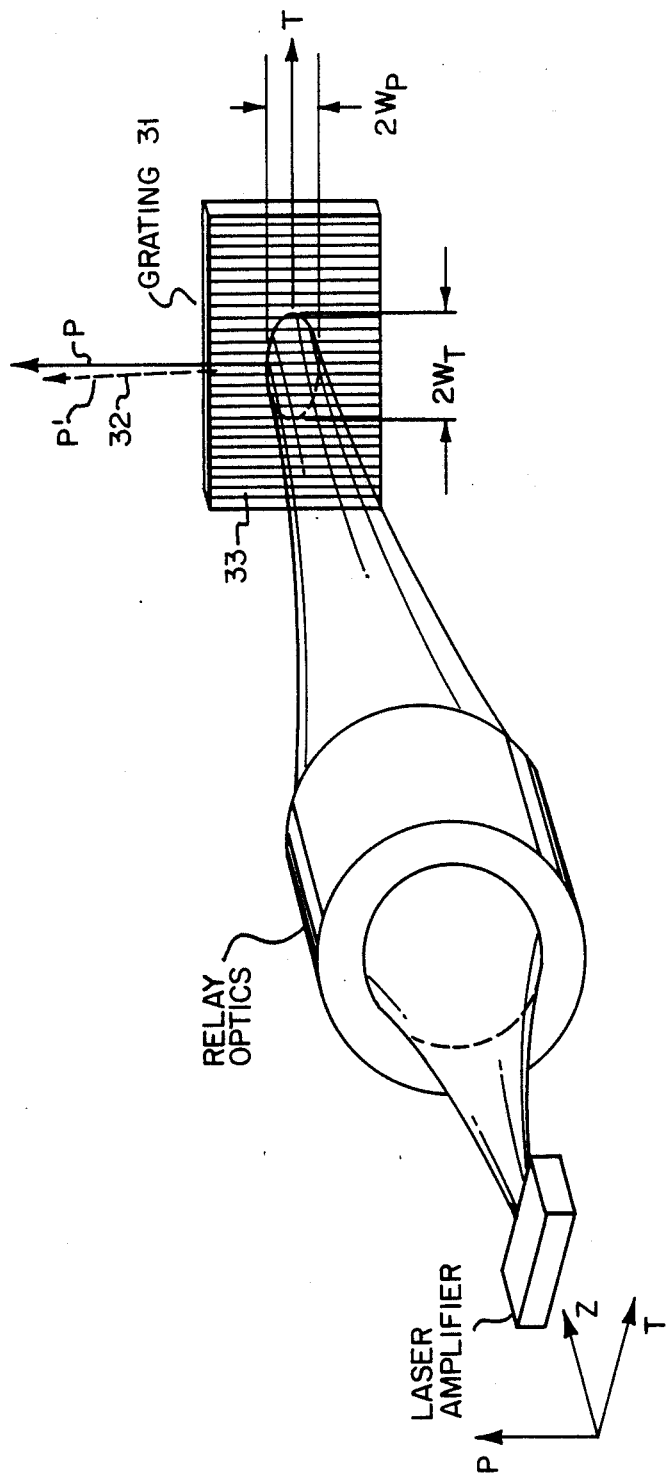
FIG. 3 is a perspective view of a grating tuned external feedback laser.
Figure 4:
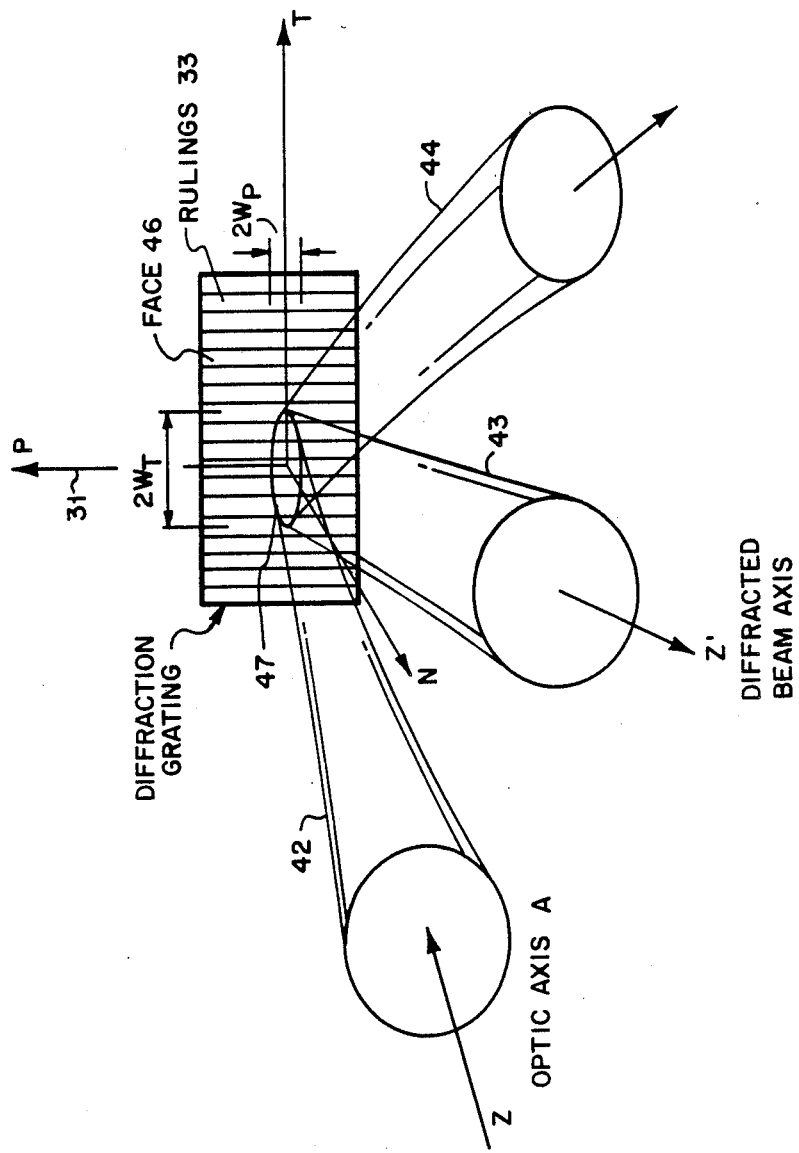
FIG. 4 illustrates a pair of orders generated by an incident beam on a diffraction grating.
Figure 5:
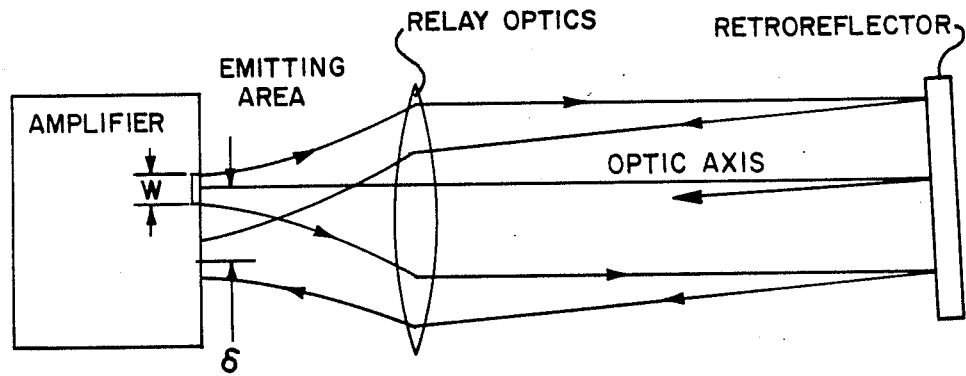
FIG. 5 illustrates the effect of lateral misalignment of optical elements in an external cavity laser.
Figure 6:
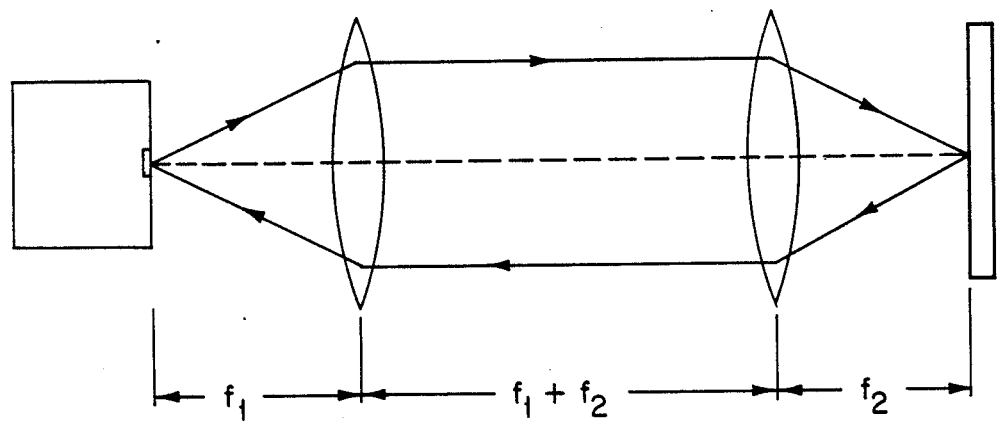
FIG. 6 illustrates a representative degenerate cavity.
Figure 7:
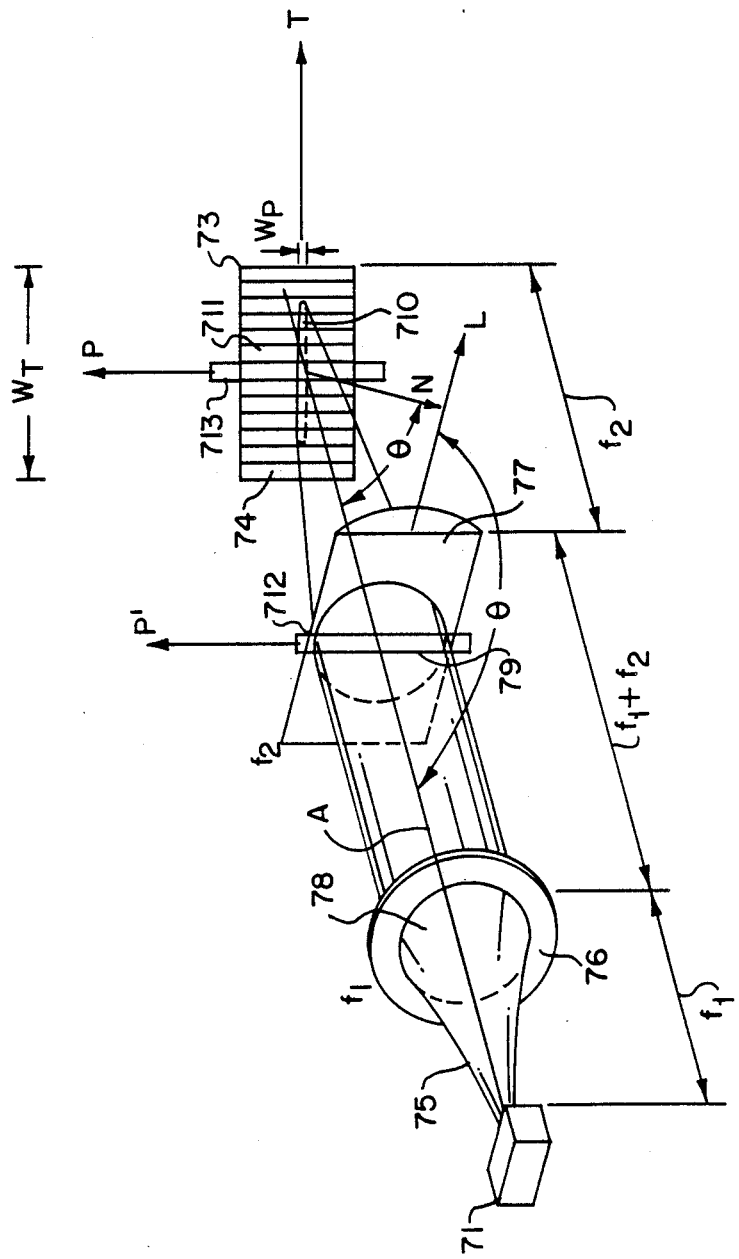
FIG. 7 illustrates the use of an anamorphic element to produce at a planar grating a laser beam waist having a width parallel to the grating rulings that is much less than its width perpendicular to these rulings.

In FIG. 7 is shown an improved grating tuned, external cavity laser. This laser system includes an optical amplifier 71, an anamorphic optical relay section 72 and a planar grating 73 containing a plurality of rulings 74. An optical beam 75 emitted from amplifier 71 is imaged to form a waist at grating 73 so that all rays of the laser beam are normal to the surface of the grating.

Grating 73 is rotatably mounted to rotate about an axis P that is substantially parallel to grating rulings 74. A set of three orthogonal axes at the grating are designated by P (the axis parallel to rulings 74), N (the axis normal to the surface of the grating) and T (the axis perpendicular to axes P and N).

Typically, amplifier 71 has an emitting surface that is approximately circular. Therefore, to produce such an elongated image on the grating, optical relay section 72 is anamorphic and typically contains anamorphic and/or astigmatic elements. Optical relay section 72 includes a cylindrically symmetric lens 76 of focal length $f_1$ and a cylindrical lens 77 oriented so that it has a focal length $f_2$ in the parallel meridional plane and an infinite focal length in the perpendicular meridional plane. Lens 77 is therefore an anamorphic optical element. Laser beam 75 forms a substantially circular laser spot 78 on lens 76 and a substantially circular laser spot 79 on lens 77, but forms a highly elongated cylindrical laser spot 710 on the front face 711 of grating 73. Since the height $W_P$ of spot 710 is much smaller (i.e., on the order of or less than one-tenth) of the width $W_T$ of spot 710, this laser system is much less sensitive to misalignment of the grating about the T axis than to rotations about the P axis to tune the laser. The extreme ellipticity of the laser spot on the grating means that this spot has substantially the shape of a line and will be referred to herein as a "linear spot".

In the Littrow configuration, axis N typically forms an angle $\theta$ on the order of 50° with the optical axis A of the laser beam. Because of this, all points of grating 73 are not at the same distance along the optical axis. Therefore, when cylindrical lens 77 is oriented substantially perpendicular to optical axis A, the average distance of grating 73 from lens 77 should be $f_2$. This optimizes the degree of imaging of the beam onto the grating as a function of the spacing between the cylindrical lens and the grating. For the particular choice of distances between elements 71, 76, 77 and 73 shown in FIG. 7, this external cavity of the laser is substantially a degenerate cavity for $\theta = \theta_m$ (where $\theta_m$ is the midpoint of the angular range over which the grating is rotated to tune the laser), thereby making this system insensitive to small lateral and angular misalignment of the elements of this external cavity.

Preferably, lens 77 forms the same angle with optical axis A as does grating 73. This results in the axis L of the cylindrical lens 77 being substantially parallel to axis T so that lens 77 produces a much more sharply focussed image on grating 73 than when axis L is not parallel to axis T. In one embodiment, lens 77 is rigidly mounted so that it does not rotate with the grating. In this embodiment, the angle Φ between axis L of lens 77 and optical axis A is selected to optimize the degree of focus over the tuning range of the laser system. This optimal angle will be substantially in the middle of the range of angles $\theta$ used to tune the laser.

In an alternate embodiment, this parallelism is maintained for all angles $\theta$ by mechanical and or electromechanical mechanisms. This system is fairly insensitive to small relative rotations of the L and T axes about respective axes parallel to the P axis. Therefore, well known inexpensive mechanical linkages can be used to rotate L and T together. For example, lens 77 can be attached to a rotatable spindle 712 that rotates about an axis P' parallel to axis P and grating 73 can be attached to a rotatable spindle 713 positioned on the P-axis. These two spindles are selected to have the same radial diameters and are coupled by a belt so that they rotate together through substantially the same angle. In another alternate embodiment, lens 77 does not rotate, but instead is selected to form an angle with optical axis A that minimizes the amount of defocus of laser spot 710 over the range of rotation about axis P. This angle will be approximately equal to the midpoint of the range of angles $\theta$ over which grating 73 is rotated.

Figure 8:
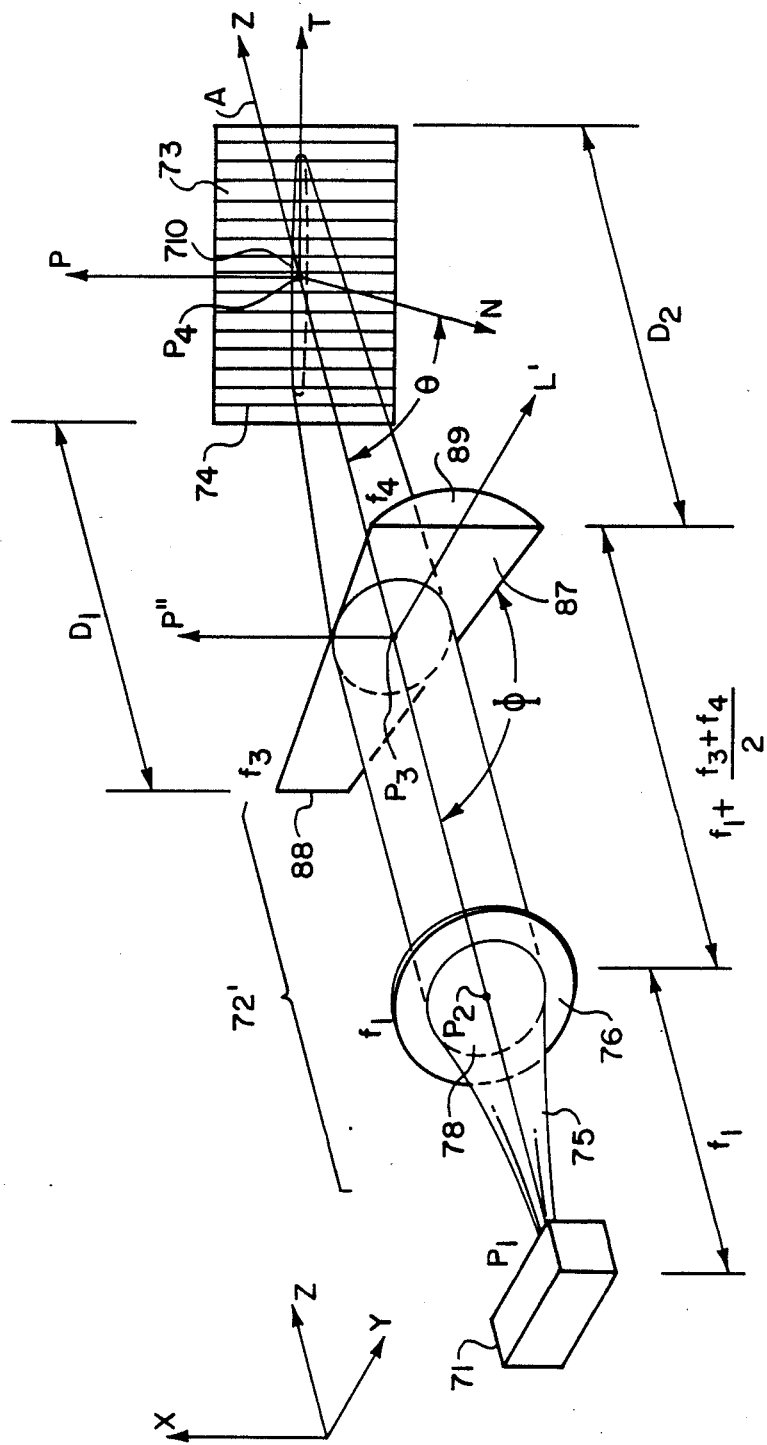
FIG. 8 illustrates an alternative embodiment of FIG. 7.

The embodiment of FIG. 8 differs from that of FIG. 7 in that optical relay section 72 is replaced by an optical relay section 72' in which cylindrical lens 77 is replaced by a conical lens 87. Because this conical lens has a smaller radius of curvature at an end 88 than it does at another end 89, the focal length $f_3$ at end 88 is smaller than the focal length $f_4$ at end 89. This enables axis L' of lens 87 to be oriented at a different angle Φ from optical axis A than the angle $\theta + \pi/2$ between axis T and the optical axis A. In particular, L' can be selected to be perpendicular to the optical axis A for all angles $\theta$ between the N axis and optical axis A. $f_1$, $f_3$ and $f_4$ are then selected to optimize the degree of focussing over the tuning range of this laser system. Such optimization is substantially achieved by selecting $f_3$ and $f_4$ to focus the entire laser spot 710 on the front face 711 of grating 73 at the midpoint $\theta_m$ of the range of tuning angles $\theta$.

In FIG. 8, the z axis coincides with the optical axis A, the x axis is parallel to the P axis and the y axis form a right-handed triad with the x- and z-axes. By "projective distance" between two elements in this Figure is meant the difference in z-coordinate between two points on these two elements with the same x- and y- coordinate values. $D_1$ is the projective distance between end 88 of lens 87 and its projective (in the z-direction) image on grating 73. $D_2$ is the projective distance between end 89 of lens 87 and its projective (in the z-direction) image on grating 73. $f_3$ and $f_4$ are respectively chosen to equal $D_1$ and $D_2$ for $\theta=\theta_m$. For the particular choice of (on z-axis) separations between elements 71, 76 and 87 presented in FIG. 8, the external cavity of this laser system is degenerate for $\theta=\theta_m$ and is therefore insensitive to small translational misalignment of the elements of this system.

In an alternative embodiment, conical lens 87 can be mounted on a rotatable spindle aligned along a rotational axis P'''. Just as in the embodiment of FIG. 7, the anamorphic element (in this case, element 87) can be made to rotate equally with grating 73.

For high efficiency, if is advantageous to use a lens 76 with a small focal length $f_1$ to capture a high fraction of the light from the laser. However, such a lens 76 produces a collimated cylindrical beam of smaller lateral dimensions than the width $W_T$ of the desired laser spot on the diffraction grating 73. Therefore, optical elements are needed in the optical relay to expand the laser beam.

Figure 9:
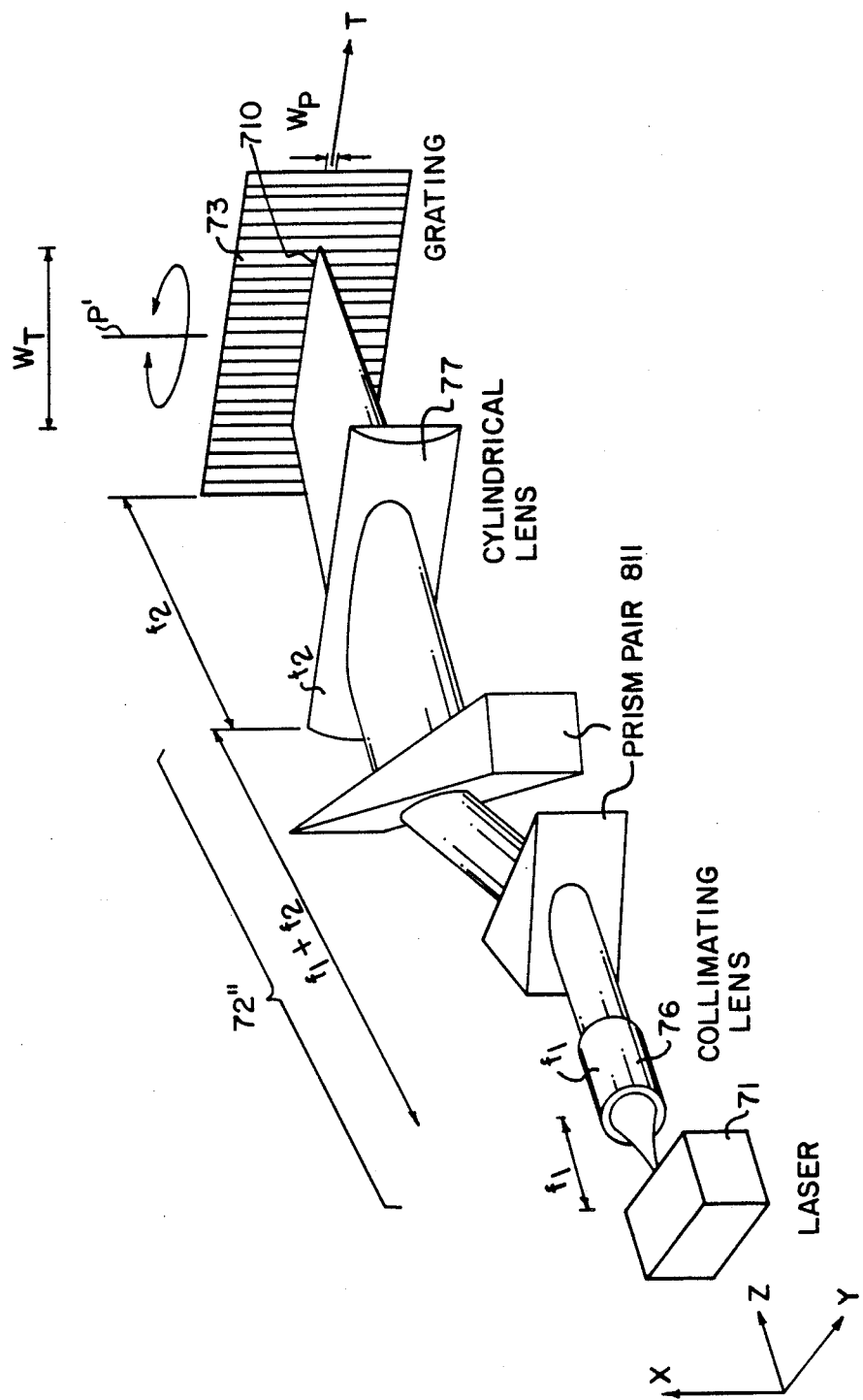
FIG. 9 illustrates an additional embodiment of a grating tuned external cavity laser.

In FIG. 9 is shown an additional embodiment of a grating tuned external cavity laser in which optical relay 72 is replaced by an optical relay 72'' that includes a beam expander such as prism pair 811. A "nonhomogeneous beam expander" is an element that stretches one lateral dimension of a beam differently than its perpendicular lateral dimension. A "homogeneous beam expander" expands both perpendicular lateral dimensions of a beam equally. Prism pair 811 is an example of a nonhomogeneous beam expander and is used to increase the width $W_T$ of laser spot 710. As in the embodiment of FIG. 7, cylindrical lens 77 reduces the height $W_P$ of laser spot 710. In other embodiments, cylindrical lens 77 can be replaced by a spherical lens (resulting in a taller laser spot 73) or by a conical lens (resulting in the advantages of the embodiment in FIG. 8). In still other embodiments, prism pair 811 can be replaced by a homogeneous beam expander. However, the use of both a nonhomogeneous beam expander to increase $W_T$ and an anamorphic element to decrease $W_P$ produces an increased ration of $W_T:W_P$, thereby producing the greatest insensitivity to rotations about the T axis for a given sensitivity to rotations about the P axis.

The above embodiments are also adaptable to systems in which the grating is not planar. In nonplanar gratings, the grating rulings are not parallel lines. For example, in holographic gratings, the lines are just the intersections of the grating surface with a set of hyperboloids produced by interference between a pair of laser beams used in a photolithographic process to produce the grating. For such a grating, the P axis is selected to be maximally parallel to these curving rulings. The P axis will then be referred to as being substantially parallel to these rulings, even though these rulings are curved and only have an average tangential direction parallel to axis P.

We claim:

1. A grating tuned laser system comprising:
   a laser amplifier (71) that emits a laser beam (75) along an optical axis A, said laser beam having a pair of lateral dimensions $W_P$ and $W_T$ where $W_P$ is measured along a direction parallel to an axis P perpendicular to optical axis A and $W_T$ is measured along a direction parallel to an axit T perpendicular to axes A and P, said lateral dimensions $W_P$ and $W_T$ being referred to herein as laser beam height and width, respectively;
   a grating (73) positioned in the path of said laser beam (75) and oriented relative to said laser amplifier to produce a diffraction order that retroreflects back to the laser amplifier (71), thereby forming an external cavity with said laser amplifier (71);
   wherein said grating (73) is rotatable about axis P to enable tuning of the laser amplifier (71);
   wherein said grating (73) contains a set of grating rulings (74) that are substantially parallel to axis P; and
   wherein a normal N to a front face (711) of the grating (73) at the intersection of the optical axis with the grating (73) makes an angle $\theta$ with the optical axis A at the grating;
   optical relay means, positioned in the path of said laser beam between the laser amplifier and the grating, for reducing the ratio of laser beam height to laser beam width to produce on said grating (73) a laser spot (710) having a ratio of height $W_P$ to width $W_T$ much less than 1.

2. A grating tuned laser system as in claim 1 wherein the ratio $W_P/W_T$ is on the order of or less than 0.1.

3. A grating tuned laser system as in claim 1 wherein said optical relay means (72) produces a laser beam (75) having wavefronts (16) at the grating (73) that are tangent to the front face (711) of the grating (73).

4. A grating tuned laser system as in claim 3 wherein said grating (73) is a planar grating having parallel equally spaced grating rulings (74) and wherein said optical relay means (72) produces a laser beam (75) having at the grating (73) a waist (15) in both of its principal meridional planes (the xz-and yz-planes).

5. A grating tuned laser system as in claim 1 wherein the optical relay means comprises a cylindrical lens (77).

6. A grating tuned laser system as in claim 5 wherein the separation between the grating (73) and the cylindrical lens (77) along the direction of the laser beam is selected to maximize the average feedback of the external cavity over the tuning range of the laser system.

7. A grating tuned laser system as in claim 5 wherein said cylindrical lens (77) is substantially perpendicular to the optical axis A of the laser beam (75) at said cylindrical lens (77).

8. A grating tuned laser system as in claim 5 wherein said cylindrical lens (77) is substantially parallel to the grating (73) for all angles $\theta$.

9. A grating tuned laser system as in claim 5 wherein said cylindrical lens (77) is oriented at a fixed angle $\Phi$ relative to optical axis A at the cylindrical lens (77), said angle $\Phi$ being selected to optimize, at a single wavelength within the tuning range of the laser, the degree of focus on the grating (73).

10. A grating tuned laser system as in claim 5 wherein said cylindrical lens (77) is oriented at a fixed angle $\Phi$ relative to said optical axis A of the laser beam at the cylindrical lens, said angle Φ being selected to maximize the average feedback of the external cavity over the tuning range of the laser system.

11. A grating tuned laser system as in claim 1 wherein the optical relay means comprises a conical lens (87).

12. A grating tuned laser system as in claim 11 wherein the separation between the grating (73) and the conical lens (87) along the direction of the laser beam (75) is selected to maximize the average degree of focus of the laser beam (75) onto the grating (73).

13. A grating tuned laser system as in claim 11 wherein said conical lens (87) is substantially perpendicular to the optical axis A of the laser beam (75) at said conical lens (87).

14. A grating tuned laser system as in claim 11 wherein said conical lens (87) is substantially parallel to the grating (73) for all angles θ.

15. A grating tuned laser system as in claim 11 wherein said conical lens (87) is oriented at a fixed angle Φ relative to optical axis A that optimizes the degree of focus on the grating at a wavelength within the tuning range of the laser.

16. A grating tuned laser system as in claim 11 wherein said conical lens (87) is oriented at a fixed angle Φ relative to said optical axis A of the laser beam (73) at the conical lens (87), said angle Φ being selected to maximize the average feedback of the external cavity over the tuning range of the laser system.

17. A grating tuned laser system as in claim 1 wherein the optical relay means (72) comprises:
a beam expander (811) that expands the beam (75) at the grating (73) in a direction (T) substantially perpendicular to the rulings (74) of the grating (73).

18. A grating tuned laser system as in claim 1 wherein the optical relay means (72) further comprises a graded index rod lens (76).

19. A grating tuned laser system as in claim 1 wherein said optical relay means and grating (73) form a degenerate external cavity with the laser amplifier.

* * * * *

UNITED STATES PATENT AND TRADEMARK OFFICE
CERTIFICATE OF CORRECTION

PATENT NO. : 4,942,583

DATED : July 17, 1990

INVENTOR(S) : Moshe Nazarathy, Paul Zorabedian, William R. Trutna, Jr. and Tirumala R. Ranganath It is certified that error appears in the above-identified patent and that said Letters Patent is hereby corrected as shown below:

ON THE TITLE PAGE: Item [75] change inventor's name "William Richard" to "William R. Trutna, Jr."

Signed and Sealed this

Twenty-fourth Day of November, 1992

Attest:

DOUGLAS B. COMER

Attesting Officer

Acting Commissioner of Patents and Trademarks